(12) United States Patent
Rajagopal et al.

(10) Patent No.: US 10,763,251 B2
(45) Date of Patent: Sep. 1, 2020

(54) ESD NETWORK COMPRISING VARIABLE IMPEDANCE DISCHARGE PATH

(71) Applicant: Texas Instruments Incorporated, Dallas, TX (US)

(72) Inventors: Krishna Praveen Mysore Rajagopal, Santa Clara, CA (US); James P Di Sarro, Plano, TX (US); Mariano Dissegna, Plano, TX (US); Lihui Wang, Cupertino, CA (US); Ann Margaret Concannon, Palo Alto, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 243 days.

(21) Appl. No.: 15/715,988

(22) Filed: Sep. 26, 2017

(65) Prior Publication Data
US 2019/0096874 A1   Mar. 28, 2019

(51) Int. Cl.
*H02H 9/04*       (2006.01)
*H01L 27/02*      (2006.01)
*H02H 3/20*       (2006.01)
*H01L 29/808*     (2006.01)

(52) U.S. Cl.
CPC ...... *H01L 27/0266* (2013.01); *H01L 27/0285* (2013.01); *H02H 3/20* (2013.01); *H02H 9/046* (2013.01); *H01L 27/0251* (2013.01); *H01L 29/8083* (2013.01); *H02H 9/04* (2013.01); *H02H 9/041* (2013.01); *H02H 9/043* (2013.01)

(58) Field of Classification Search
USPC .......................................... 361/56, 91.1, 111
See application file for complete search history.

(56) References Cited

U.S. PATENT DOCUMENTS

| | | | |
|---|---|---|---|
| 6,239,958 B1 | 5/2001 | Kato | |
| 7,009,229 B1 | 3/2006 | Lin | |
| 7,112,828 B2 | 9/2006 | Higashida | |
| 8,558,276 B2 | 10/2013 | Bobde | |
| 8,724,273 B2 * | 5/2014 | Morrish | H02H 9/025 327/427 |
| 8,730,624 B2 | 5/2014 | Chang | |
| 8,988,132 B2 | 3/2015 | Sawada | |
| 9,035,363 B2 | 5/2015 | Rountree | |
| 2005/0047037 A1 | 3/2005 | Litwin | |
| 2010/0232081 A1* | 9/2010 | Disney | H01L 27/0266 361/91.5 |
| 2013/0001656 A1* | 1/2013 | El-Kareh | H01L 29/66901 257/263 |

* cited by examiner

*Primary Examiner* — Danny Nguyen
(74) *Attorney, Agent, or Firm* — Jacqueline J. Garner; Charles A. Brill; Frank D. Cimino (57) ABSTRACT

A semiconductor device has a protected line connected to a ground line by a triggered clamp. A variable shunt, which includes a depletion mode JFET, is connected between the protected line and the ground line, in parallel with the triggered clamp. The depletion mode JFET is formed in a substrate of the semiconductor device. The channel of the depletion mode JFET provides a resistive path for the variable shunt when the semiconductor device is unpowered, to dissipate charge from the powered line after an ESD event. When the semiconductor device is operated, that is, powered up, the gate of the depletion mode JFET may be biased to turn off the channel, and so reduce impairment of operation of the semiconductor device.

23 Claims, 8 Drawing Sheets

ESD NETWORK COMPRISING VARIABLE IMPEDANCE DISCHARGE PATH

FIELD

This disclosure relates to the field of semiconductor devices. More particularly, this disclosure relates to electrostatic discharge (ESD) circuits in semiconductor devices.

BACKGROUND

Semiconductor devices are susceptible to damage from electrostatic discharge (ESD) events. ESD events may produce voltage overstress on components such as metal oxide semiconductor (MOS) transistors, resulting in failure or reduced reliability of the components. Signal pads of semiconductor devices are commonly connected to internal power and ground lines through diodes which are reverse biased during normal operation. The diodes provide conductive paths from the signal pads to the power and ground lines during ESD events, thus reducing the damaging effects of the voltage overstress on components connected to the signal pads. Voltage clamps are commonly connected between the power and ground lines, to reduce voltage transients during ESD events. An effective clamp includes a trigger circuit with a resistor-capacitor (RC) low-pass filter connected to a source follower. The trigger circuit drives a clamp MOS transistor connected between the power and ground lines. A limitation of this voltage clamp is exhibited during two or more ESD events in rapid succession: charge builds up on the power line, and does not sufficiently dissipate before the next ESD event, inhibiting timely triggering of the source follower, resulting in voltage overstress on components connected to the power line.

SUMMARY

The present disclosure introduces a system for dissipating charge from a protected line of a semiconductor device, the protected line being protected by a triggered clamp. In one implementation, the disclosed system involves a variable shunt which includes a depletion mode junction field effect transistor (JFET), the variable shunt connecting the protected line to semiconductor material in a substrate of the semiconductor device. Advantageously, the depletion mode JFET provides a resistive path for the variable shunt when the semiconductor device is unpowered, which is when the semiconductor device is most susceptible to ESD events. The depletion mode JFET may be formed in the semiconductor device without adding process steps.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device has a protected line which is protected from ESD events by a triggered clamp connecting the protected line to a ground line of the semiconductor device. The protected line may include one or more interconnect lines, with associated vias and optionally contacts, of the semiconductor device. The protected line may be, for example, an internal power supply line, such as a Vdd line for core transistors. In another example, the protected line may be a power supply line connected to an input pad of the semiconductor device. The ground line may also include one or more interconnect lines, with associated vias and optionally contacts. The ground line is connected to semiconductor material of a substrate of the semiconductor device.

The triggered clamp may include, for example, an RC low pass filter connected between the protected line and the ground line. The RC low pass filter may be connected to a gate of a source follower which drives a clamp MOS transistor connecting the protected line to the ground line. The RC low pass filter, the source follower and the clamp MOS transistor are components of the triggered clamp. Other embodiments of the triggered clamp are with the scope of this disclosure.

The semiconductor device further has a variable shunt connecting the protected line to the ground line. The variable shunt includes a depletion mode JFET formed in the substrate. A source of the depletion mode JFET is connected to the protected line. A drain of the depletion mode JFET contacts the semiconductor material of the substrate. When the semiconductor device is unpowered, a gate of the deletion mode JFET may be unbiased, so that the deletion mode JFET has a conductive channel between the source and the drain which provides a low impedance in the variable shunt from the protected line to the semiconductor material of the substrate. After an ESD event in this state, charge on the protected line flows through the variable shunt to the substrate, thus enabling the triggered clamp to operate as desired during a subsequent ESD event. When the semiconductor device is operating, the gate of the deletion mode JFET may be biased so as to turn off the channel, which provides a high impedance in the variable shunt, thus enabling operation of the semiconductor device without current drain from the protected line.

The examples disclosed herein describe the variable shunts with p-channel deletion mode JFETs connecting to p-type semiconductor material. It is recognized that similar variable shunts may be formed with n-channel deletion mode JFETs connecting to n-type semiconductor material, by appropriate changes in dopant polarities. It is noted that terms such as top, upper, lower, over, above, under, and below may be used in this disclosure. These terms should not be construed as limiting the position or orientation of a structure or element, but should be used to provide spatial relationship between structures or elements. For the purposes of this disclosure, it will be understood that, if an element is referred to as being "connected" or "coupled" to another element, it may be directly connected or directly coupled to the other element, or intervening elements may be present.

Figure 1:
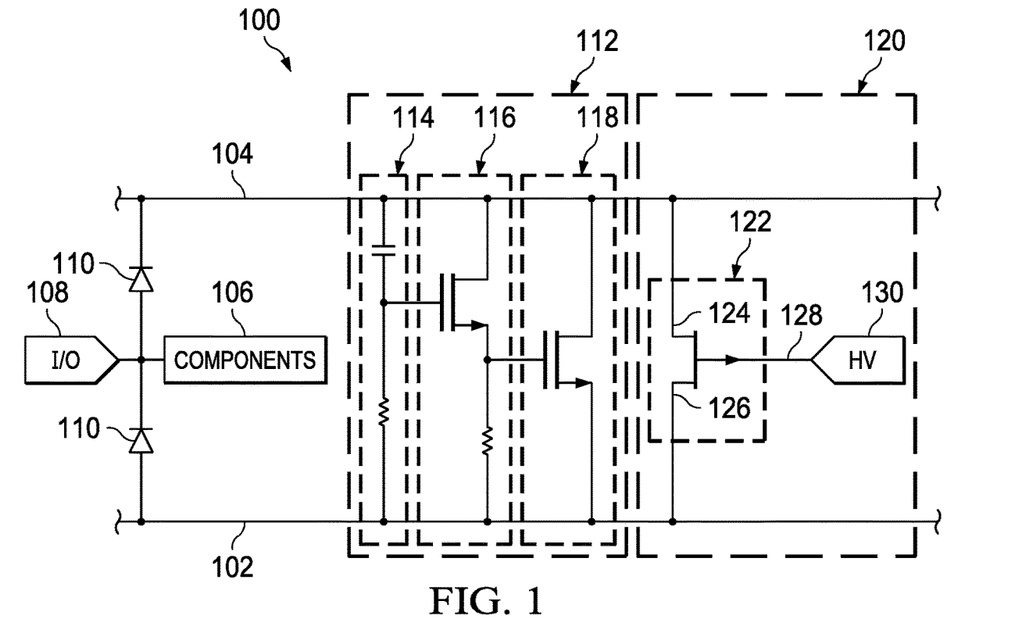
FIG. 1 is a circuit schematic of a portion of an example semiconductor device having a triggered clamp in parallel with a variable shunt.

FIG. 1 is a circuit schematic of a portion of an example semiconductor device having a triggered clamp in parallel with a variable shunt. The semiconductor device 100 includes a ground line 102, and a protected line 104. The ground line 102 is connected to semiconductor material in a substrate of the semiconductor device 100. The semiconductor device 100 includes one or more components 106 connected to an input/output pad 108. The semiconductor device 100 may include protection diodes 110, connected between the protected line 104 and the components 106, and connected between the components 106 and the ground line 102. The protection diodes 110 are oriented to become forward biased when a potential on the input/output pad 108 is higher than a potential of the protected line 104 or lower than a potential on the ground line 102. Thus the protection diodes 110 protect the components 106 from voltage overstress, for example during an ESD event.

The semiconductor device 100 includes a triggered clamp 112 which connects the protected line 104 to the ground line 102. In the instant example, the triggered clamp 112 may include, for example, an RC low pass filter 114 connected to drive a source follower 116, with the source follower 116 connected to drive a clamp MOS transistor 118. The clamp MOS transistor 118 is connected between the protected line 104 and the ground line 102.

The semiconductor device 100 further includes a variable shunt 120 which connects the protected line 104 to the ground line 102, in parallel with the triggered clamp 112. The variable shunt 120 includes a depletion mode JFET 122. In a version of the instant example in which the semiconductor material in the substrate connected to the ground line 102 is p-type, the depletion mode JFET 122 may be a p-channel depletion mode JFET 122 as depicted in FIG. 1. In this version, a source 124 of the depletion mode JFET 122 is connected to the protected line 104 and a drain 126 of the depletion mode JFET 122 is connected to the ground line 102, through contact with the p-type semiconductor material of the substrate. In an alternate version of the instant example, in which the semiconductor material in the substrate connected to the ground line 102 is n-type, the depletion mode JFET may be an n-channel depletion mode JFET, with a drain connected to the protected line 104 and a source connected to the ground line 102, through contact with the n-type semiconductor material of the substrate. A gate 128 of the depletion mode JFET 122 is configured to be biasable when the semiconductor device 100 is operational. In the instant example, the gate 128 may be connected to a pad 130 of the semiconductor device 100 so that bias may be applied from a voltage source, not shown, external to the semiconductor device 100.

When the semiconductor device 100 is non-operational, the gate 128 of the depletion mode JFET 122 is unbiased, so that the depletion mode JFET 122 has a resistive channel from the source 124 to the drain 126. In this condition, the variable shunt 120 thus provides a conductive path from the protected line 104 to the ground line 102. During an ESD event, a high voltage on the protected line 104, relative to the ground line 102, may cause the triggered clamp 112 to turn on, reducing the voltage on the protected line 104. The triggered clamp 112 may subsequently turn off, leaving some positive charge on the protected line 104. The positive charge may dissipate through the variable shunt 120, advantageously leaving the triggered clamp 112 enabled to turn on in response to a subsequent ESD event.

When the semiconductor device 100 is operational, which includes being powered for functional operation, the gate 128 may be biased to turn off the depletion mode JFET 122. In the case of a p-channel depletion mode JFET 122, the gate 128 may be biased to a positive potential with respect to the source 124. Thus, operation of the semiconductor device 100 is advantageously unimpeded by current drain through the variable shunt 120.

Figure 2:
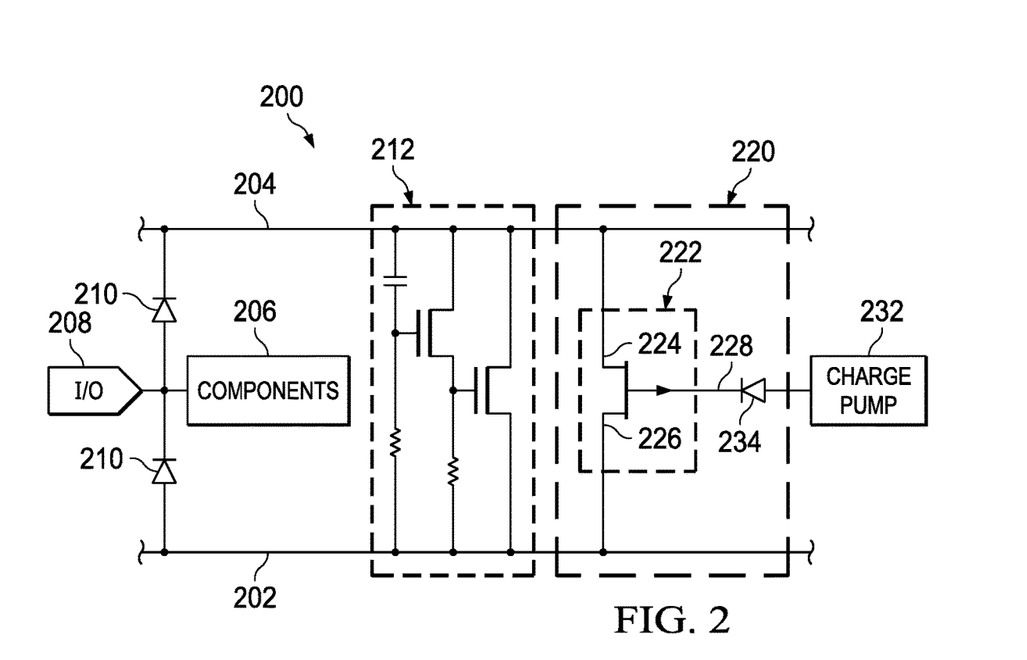
FIG. 2 is a circuit schematic of a portion of another example semiconductor device having a triggered clamp in parallel with a variable shunt.

FIG. 2 is a circuit schematic of a portion of another example semiconductor device having a triggered clamp in parallel with a variable shunt. The semiconductor device 200 includes a protected line 204, and a ground line 202 which is connected to semiconductor material in a substrate of the semiconductor device 200. The semiconductor device 200 may include components 206 connected to an input/output pad 208 and coupled to the protected line 204 and the ground line 202 through protection diodes 210.

The semiconductor device 200 includes a triggered clamp 212 which connects the protected line 204 to the ground line 202. The triggered clamp 212 may be similar to the triggered clamp 112 of FIG. 1. Other structures for the triggered clamp 212 are within the scope of the instant example.

The semiconductor device 200 further includes a variable shunt 220 which connects the protected line 204 to the ground line 202, in parallel with the triggered clamp 212. The variable shunt 220 includes a depletion mode JFET 222, depicted in FIG. 2 as a p-channel depletion mode JFET 222. In this version, a source 224 of the depletion mode JFET 222 is connected to the protected line 204 and a drain 226 of the depletion mode JFET 222 is connected to the ground line 202, through contact with p-type semiconductor material of the substrate. A gate 228 of the depletion mode JFET 222 is configured to be biasable when the semiconductor device 200 is operational. In the instant example, the gate 228 may be connected to a charge pump 232 of the semiconductor device 200 so that bias may be applied when the semiconductor device 200 is operational.

The variable shunt 220 may also include a blocking diode 234 in series between the gate 228 and the charge pump 232. The blocking diode 234 may prevent damage to the charge pump 232 when a potential on the gate 228 is sufficiently high otherwise to cause damage to the charge pump 232. In one example, when the semiconductor device 200 is powered up and power is applied to the protected line 204, but power has not yet been applied to the charge pump 232, the blocking diode 234 may protect an output buffer of the charge pump 232. In another example, there may be applications in which a signal is applied to the protected line 204, but a portion of the semiconductor device 200 powered by the charge pump 232 is intended to be unpowered. In such a case, the blocking diode 234 could protect the charge pump 232 from a spurious transient.

Figure 3:
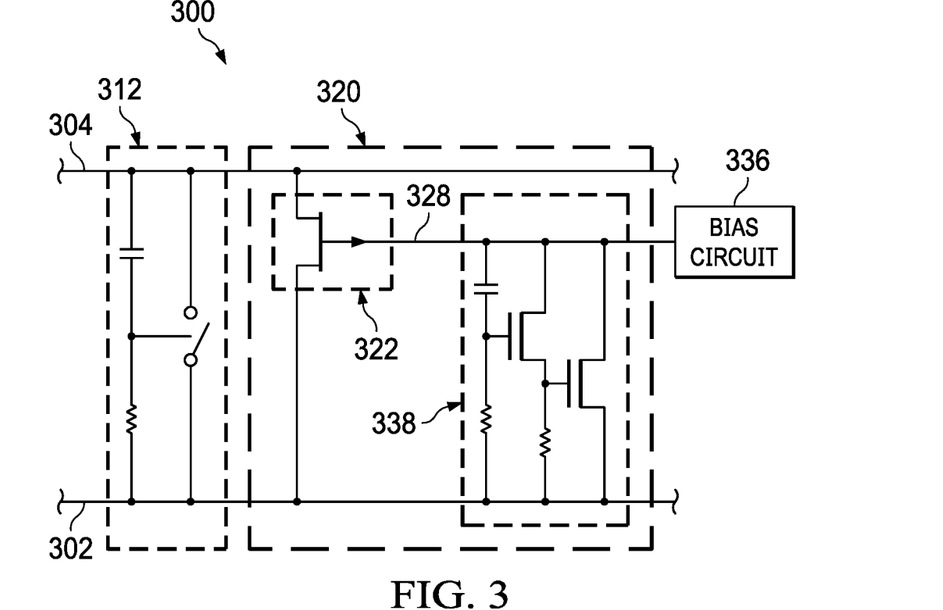
FIG. 3 is a circuit schematic of a portion of another example semiconductor device having a triggered clamp in parallel with a variable shunt.

FIG. 3 is a circuit schematic of a portion of another example semiconductor device having a triggered clamp in parallel with a variable shunt. The semiconductor device 300 includes a protected line 304, and a ground line 302 which is connected to semiconductor material in a substrate of the semiconductor device 300. The semiconductor device 300 includes a triggered clamp 312 which connects the protected line 304 to the ground line 302. The triggered clamp 312 may have any structure which connects the protected line 304 to the ground line 302 in an overvoltage condition, and may include, for example a four-layer component, sometimes referred to as a silicon-controlled rectifier (SCR).

The semiconductor device 300 further includes a variable shunt 320 which connects the protected line 304 to the ground line 302, in parallel with the triggered clamp 312. The variable shunt 320 includes a depletion mode JFET 322, for example as described in reference to FIG. 1. A gate 328 of the depletion mode JFET 322 is configured to be biasable when the semiconductor device 300 is operational. In the instant example, the gate 328 may be connected to a bias circuit 336 of the semiconductor device 300 so that bias may be applied when the semiconductor device 300 is operational.

The variable shunt 320 may further include a gate clamp 338 which connects the gate 328 to the ground line 302. The gate clamp 338 is configured to provide a low impedance connection between the gate 328 and the ground line 302 when a potential of the gate 328 exceeds a prescribed value. The gate clamp 338 may have a similar structure to the triggered clamp 112 of FIG. 1, or other structure such as a Zener diode. The gate clamp 338 may protect the bias circuit 336 from an overvoltage condition on the gate 328.

Figure 4:
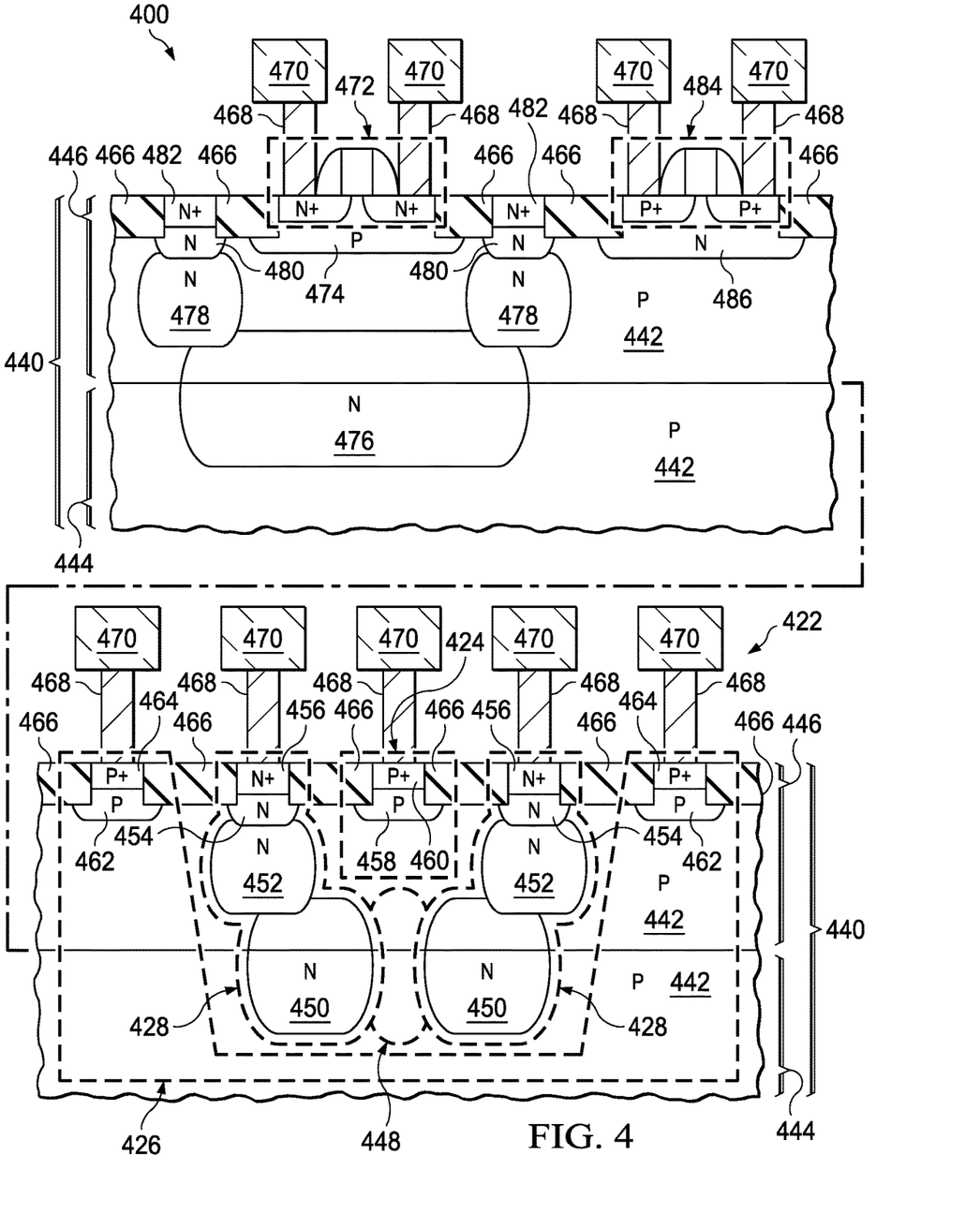
FIG. 4 is a cross section of an example semiconductor device having a triggered clamp in parallel with a variable shunt.

FIG. 4 is a cross section of an example semiconductor device having a triggered clamp in parallel with a variable shunt. The semiconductor device 400 has a substrate 440 which includes semiconductor material 442 of a base wafer 444 and an epitaxial layer 446 on a top surface of the base wafer 444. In the instant example, the semiconductor material 442 may be p-type.

The semiconductor device 400 includes a depletion mode JFET 422 formed in the substrate 440. The depletion mode JFET 422 is part of a variable shunt which connects a protected line, not shown in FIG. 4, of the semiconductor device 400 to a ground line, not shown in FIG. 4, of the semiconductor device 400. The ground line is electrically connected to the semiconductor material 442. The depletion mode JFET 422 has a gate 428 which laterally surrounds a p-type channel region 448. In the instant example, the gate 428 may include a first lower n-type buried layer 450 which extends into the base wafer 444 and into the epitaxial layer 446, a first upper n-type buried layer 452 above the first lower n-type buried layer 450, a first shallow n-type well 454 above the first upper n-type buried layer 452, and n-type gate contact regions 456 above the first shallow n-type well 454. The first lower n-type buried layer 450, the first upper n-type buried layer 452, the first shallow n-type well 454, and the n-type gate contact regions 456 are contiguous. A source 424 of the depletion mode JFET 422 includes a source portion of the epitaxial layer 446 that is laterally surrounded by the gate 428 and is located above the channel region 448, a first shallow p-type well 458 in the source portion of the epitaxial layer 446, and a p-type source contact region 460 above the first shallow p-type well 458. A drain 426 of the depletion mode JFET 422 includes a drain portion of the p-type semiconductor material 442 under and laterally surrounding the gate 428, a second shallow p-type well 462 above the drain portion of the p-type semiconductor material 442, and a p-type drain contact region 464 above the second shallow p-type well 462. In the instant example, the depletion mode JFET 422 is a vertical JFET, in that current flowing through the channel region 448 flows primarily in a vertical direction, that is, perpendicular to a top surface of the substrate 440. The p-type source contact region 460, the n-type gate contact region 456, and the p-type drain contact region 464 may be laterally isolated from each other by field oxide 466. The field oxide 466 may have a shallow trench isolation (STI) structure as depicted in FIG. 4, or may have a local oxidation of silicon (LOCOS) structure.

The source 424 is electrically connected to the protected line, for example, through one or more contacts 468 and interconnects 470 of the semiconductor device 400. The drain 426 is electrically connected to the ground line, possibly through one or more of the contacts 468 and interconnects 470. The gate 428 is connected to a bias path which may include one or more of the contacts 468 and interconnects 470. The bias path may extend to an input pad of the semiconductor device 400, so that bias to the gate 428 may be applied from a voltage source external to the semiconductor device 400. Alternatively, the bias path may extend to a voltage source, such as a charge pump, in the semiconductor device 400.

When the semiconductor device 400 is unpowered, the gate 428 may be unbiased, so that the channel region 448 provides a resistive path between the source 424 and the drain 426. When the semiconductor device 400 is operated, that is, power being applied to the semiconductor device 400, the gate 428 may be biased with a positive potential with respect to the source 424, so that the channel region 448 is turned off and does not conduct significant current from the source 424 to the drain 426.

The semiconductor device 400 may optionally further include additional instances of elements of the depletion mode JFET 422, wherein the corresponding elements may be formed concurrently, thereby reducing fabrication cost and complexity. For purposes of illustration, an isolated n channel metal oxide semiconductor (NMOS) transistor 472 and a p channel metal oxide semiconductor (PMOS) transistor 484 are disclosed. It is recognized that other components may also include similar additional instances of elements of the depletion mode JFET 422.

The isolated NMOS transistor 472 is in a third shallow p-type well 474 which is isolated from the p-type semiconductor material 442 of the base wafer 444 by an n-type isolation structure. The n-type isolation structure of the instant example includes a second lower n-type buried layer 476, a second upper n-type buried layer 478 above the second lower n-type buried layer 476, a second shallow n-type well 480 above the second upper n-type buried layer 478, and an n-type isolation contact region 482 above the second shallow n-type well 480. In the instant example, the second lower n-type buried layer 476 and the first lower n-type buried layer 450 may have similar structures and dopant distributions, as a result of being formed concurrently, advantageously reducing a fabrication cost of the semiconductor device 400 compared to forming the lower n-type buried layers 450 and 476 separately. Similarly, the second upper n-type buried layer 478 and the first upper n-type buried layer 452 may have similar structures and dopant distributions as a result of being formed concurrently, and the second shallow n-type well 480 and the first shallow n-type well 454 may have similar structures and dopant distributions as a result of being formed concurrently, accruing similar advantages. The n-type isolation contact region 482, the n-type gate contact regions 456, and an n-type source and drain of the isolated NMOS transistor 472 may also have similar structures and dopant distributions as a result of being formed concurrently.

The PMOS transistor 484 is located in a third shallow n-type well 486. In the instant example, the third shallow n-type well 486 and the first shallow n-type well 454 may have similar structures as a result of being formed concurrently, also accruing a reduced fabrication cost. The p-type source contact region 460, the p-type drain contact region 464 and a p-type source and drain of the PMOS transistor 484 may also have similar structures and dopant distributions as a result of being formed concurrently.

Figure 5A:
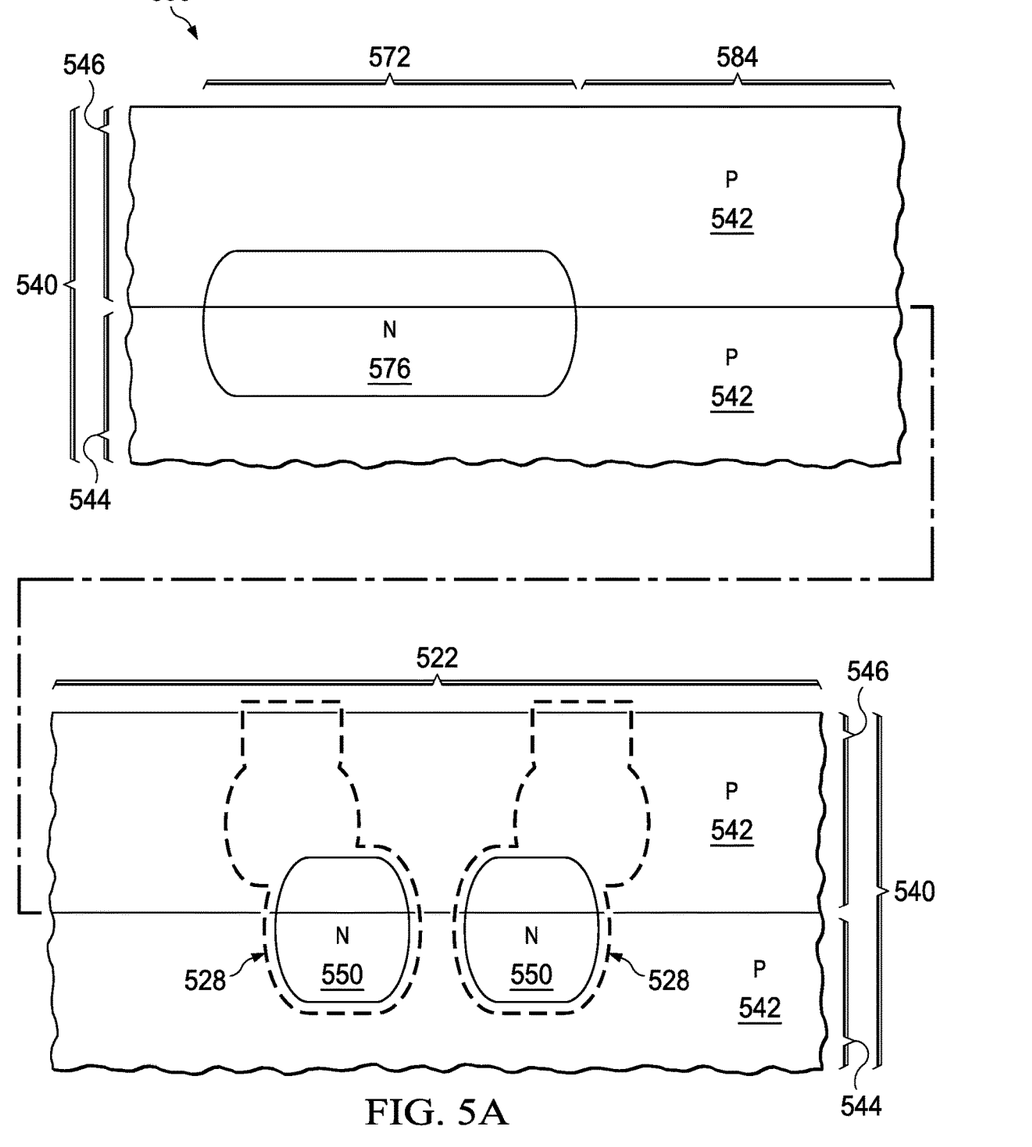
FIG. 5A through FIG. 5C are cross sections of a semiconductor device having a triggered clamp in parallel with a variable shunt, depicted in stages of an example method of formation.
Figure 5B:
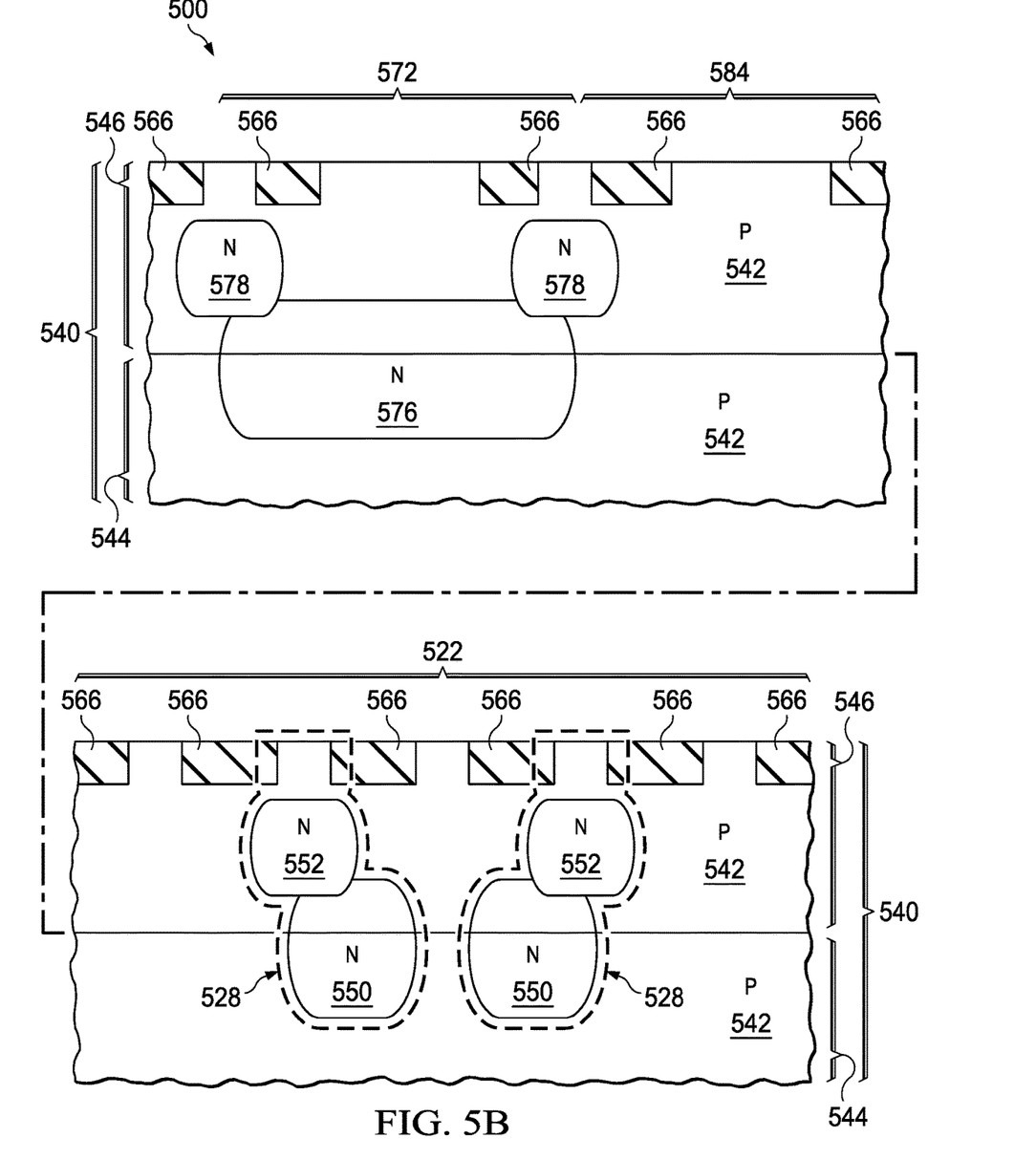
Figure 5C:
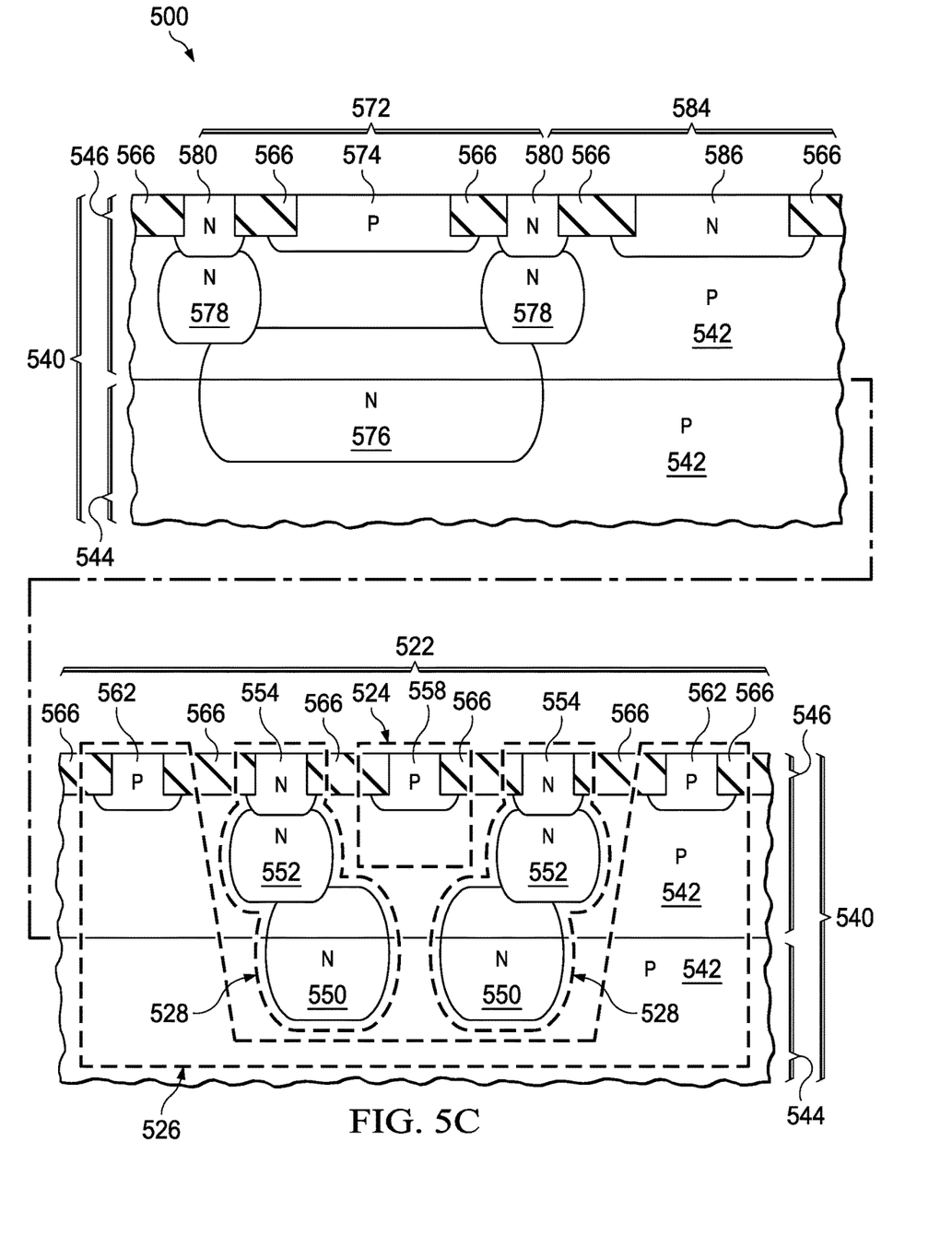

FIG. 5A through FIG. 5C are cross sections of a semiconductor device having a triggered clamp in parallel with a variable shunt, depicted in stages of an example method of formation. Referring to FIG. 5A, the semiconductor device 500 has a base wafer 544 with a first portion of p-type semiconductor material 542 extending to a top surface of the base wafer 544. A first dose of n-type dopants, such as antimony or arsenic, is implanted into the base wafer 544 in an area for a depletion mode JFET 522 of the variable shunt, and in an area for an isolated NMOS transistor 572. An epitaxial layer 546 is formed on the top surface of the base wafer 544. The epitaxial layer 546 includes a second portion of the p-type semiconductor material 542, so that the p-type semiconductor material 542 extends from the base wafer 544 to a top surface of the epitaxial layer 546. The first dose of n-type dopants diffuses downward into the base wafer 544 and upward into the epitaxial layer 546 to form a first lower n-type buried layer 550 of a gate 528 of the depletion mode JFET 522, and to form a second lower n-type buried layer 576 of an isolation structure for the isolated NMOS transistor 572. The base wafer 544 and the epitaxial layer 546 provide a substrate 540 for the semiconductor device 500. The substrate 540 includes an area for a PMOS transistor 584. Forming the first lower n-type buried layer 550 and the second lower n-type buried layer 576 concurrently may advantageously reduce a fabrication cost of the semiconductor device 500 compared to forming the lower n-type buried layers 550 and 576 separately.

Referring to FIG. 5B, field oxide 566 is formed in the substrate 540, extending into the epitaxial layer 546 to a depth of 250 nanometers to 600 nanometers from a top surface of the epitaxial layer 546. The field oxide 566 may be formed, for example, by an STI process or by a LOCOS process.

A second dose of n-type dopants, such as phosphorus, is implanted into the substrate 540 in the area for a depletion mode JFET 522 of the variable shunt, and in the area for an isolated NMOS transistor 572. The substrate 540 is subsequently annealed, thereby activating and diffusing the second dose of n-type dopants to form a first upper n-type buried layer 552 of the gate 528 of the depletion mode JFET 522, and to form a second upper n-type buried layer 578 of the isolation structure of the isolated NMOS transistor 572. Forming the first upper n-type buried layer 552 and the second upper n-type buried layer 578 concurrently may further reduce the fabrication cost of the semiconductor device 500.

Referring to FIG. 5C, a first dose of p-type dopants, such as boron, is implanted into the substrate 540 in the area for a depletion mode JFET 522 of the variable shunt, and in the area for an isolated NMOS transistor 572. A third dose of n-type dopants, for example phosphorus, is implanted into the substrate 540 in the area for a depletion mode JFET 522 of the variable shunt, in the area for an isolated NMOS transistor 572, and in the area for the PMOS transistor 584. The substrate 540 is subsequently annealed, thereby activating and diffusing the first dose of p-type dopants and the third dose of n-type dopants. The first dose of p-type dopants forms a first shallow p-type well 558 in a source 524 of the depletion mode JFET 522, a second shallow p-type well 562 in a drain 526 of the depletion mode JFET 522, and a third shallow p-type well 574 in the area for the isolated NMOS transistor 572. The third dose of n-type dopants forms a first shallow n-type well 554 in the gate 528 of the depletion mode JFET 522, a second shallow n type well 580 of the isolation structure of the isolated NMOS transistor 572, and a third shallow n-type well 586 in the area for the PMOS transistor 584. Forming the shallow p-type wells 558, 562 and 574 concurrently may further reduce the fabrication cost of the semiconductor device 500. Similarly, forming the shallow n-type wells 554 and 586 concurrently may also reduce the fabrication cost.

Formation of the semiconductor device 500 continues with formation of gate structures of the isolated NMOS transistor 572 and the PMOS transistor 584. Subsequently, n-type and p-type contact regions of the depletion mode JFET 522, and n-type and p-type sources and drains of the isolated NMOS transistor 572 and the PMOS transistor 584, respectively, are formed by implanting n-type and p-type dopants, followed by annealing the substrate. Contacts and interconnects may be formed to provide a structure for the semiconductor device 500 similar to that shown in FIG. 4.

Figure 6:
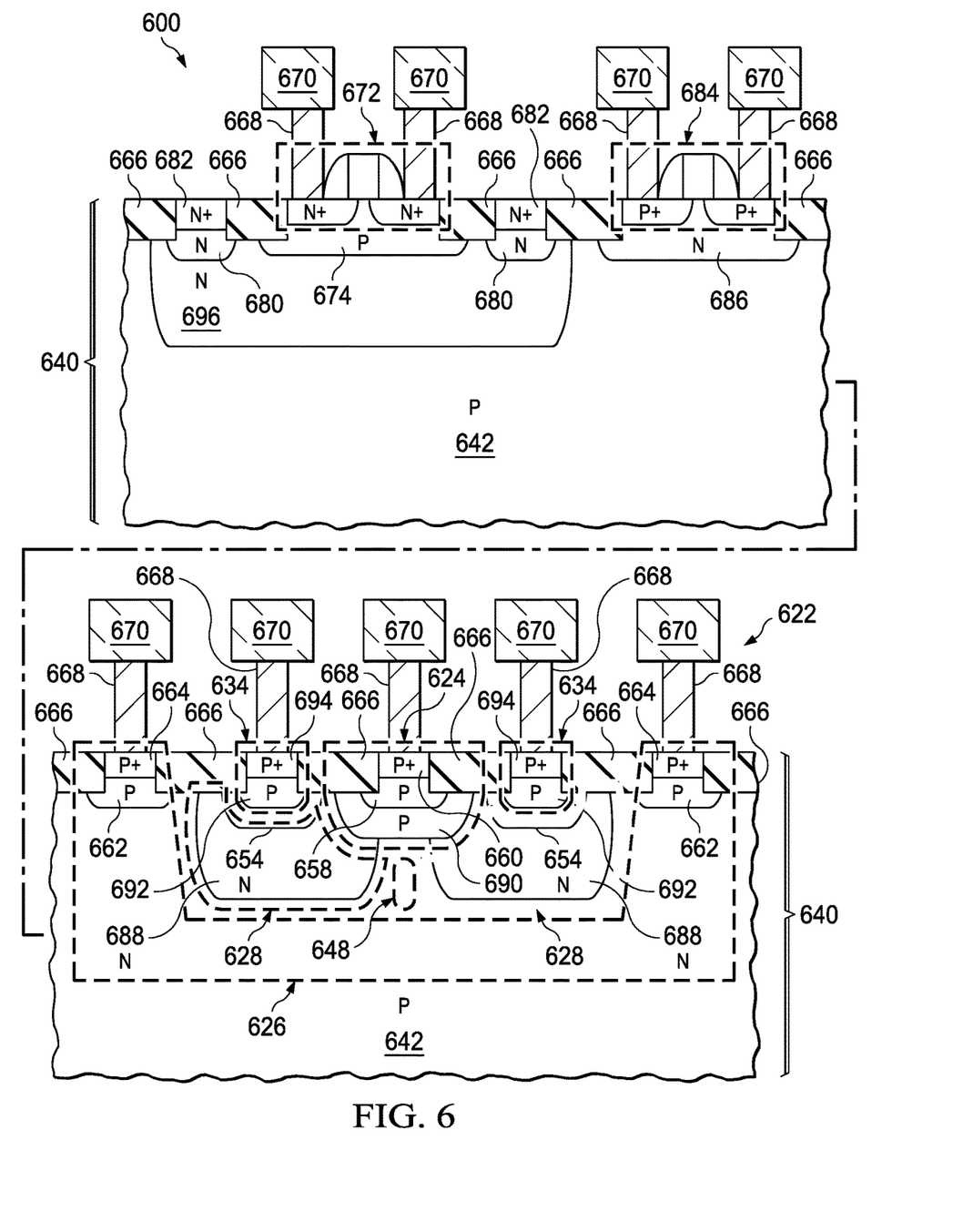
FIG. 6 is a cross section of another example semiconductor device having a triggered clamp in parallel with a variable shunt.

FIG. 6 is a cross section of another example semiconductor device having a triggered clamp in parallel with a variable shunt. The semiconductor device 600 has a substrate 640 which includes semiconductor material 642. In the instant example, the substrate 640 may be a silicon wafer, and the semiconductor material 642 may be p-type. The semiconductor device 600 includes a depletion mode JFET 622 formed in the substrate 640. The depletion mode JFET 622 is part of a variable shunt which connects a protected line to a ground line, neither of which is shown in FIG. 6. The ground line is electrically connected to the semiconductor material 642. In the instant example, the depletion mode JFET 622 is a vertical JFET, in that current flowing through the channel region 648 flows primarily in a vertical direction, that is, perpendicular to a top surface of the substrate 640.

In the instant example, the depletion mode JFET 622 has a gate 628 which laterally surrounds a p-type channel region 648. The gate 628 may include a first deep n-type well 688 which abuts the channel region 648, and a first shallow n-type well 654 in the first deep n-type well 688. The first deep n type well 688 extends deeper into the substrate 640 than the first shallow n type well 654.

A source 624 of the depletion mode JFET 622 may include a deep p-type well 690 over the channel region 648 and partially overlapping the first deep n-type well 688, a first shallow p-type well 658 in the deep p-type well 690, and a p-type source contact region 660 above the first shallow p-type well 658. The deep p-type well 690 extends deeper into the substrate 640 than the first shallow p type well 658.

A drain 626 of the depletion mode JFET 622 may include a drain portion of the p-type semiconductor material 642 under and laterally surrounding the gate 628, a second shallow p-type well 662 above the drain portion of the p-type semiconductor material 642, and a p-type drain contact region 664 above the second shallow p-type well 662.

In the instant example, a blocking diode 634 is in series with the gate 628. An anode of the blocking diode 634 may include a third shallow p-type well 692 in the first shallow n-type well 654 and a p-type anode contact region 694 above the third shallow p-type well 692. A pn junction of the blocking diode 634 is provided by the third shallow p-type well 692 and the first shallow n-type well 654, which may advantageously provide a higher reverse breakdown voltage above 20 volts.

The p-type source contact region 660, the p-type anode contact region 694, and the p-type drain contact region 664 may be laterally isolated from each other by field oxide 666. The source 624 and the drain 626 are electrically connected to the protected line, the drain 626 is electrically connected to the ground line through contacts 668 and interconnects 670 of the semiconductor device 600. The gate 628 is connected to a bias path, through the blocking diode 634, through the contacts 668 and interconnects 670 of the semiconductor device 600. The depletion mode JFET 622 may function as disclosed in reference to FIG. 4 to dissipate charge from the protected line to the ground line when the semiconductor device 600 is unpowered.

The semiconductor device 600 may optionally further include an isolated NMOS transistor 672 in a fourth shallow p-type well 674 which is isolated from the p-type semiconductor material 642 of the substrate 640 by a second deep n-type well 696. Electrical contact to the second deep n-type well 696 may be provided by a second shallow n-type well 680 in the second deep n-type well 696 and an n-type isolation contact region 682 above the second shallow n-type well 680. In the instant example, the second deep n-type well 696 and the first deep n-type well 688 may have similar structures and dopant distributions, as a result of being formed concurrently, advantageously reducing a fabrication cost of the semiconductor device 600.

The semiconductor device 600 may optionally further include a PMOS transistor 684, in a third shallow n-type well 686. The third shallow n-type well 686 and the first shallow n-type well 654 may have similar structures as a result of being formed concurrently, also accruing a reduced fabrication cost.

Figure 7:
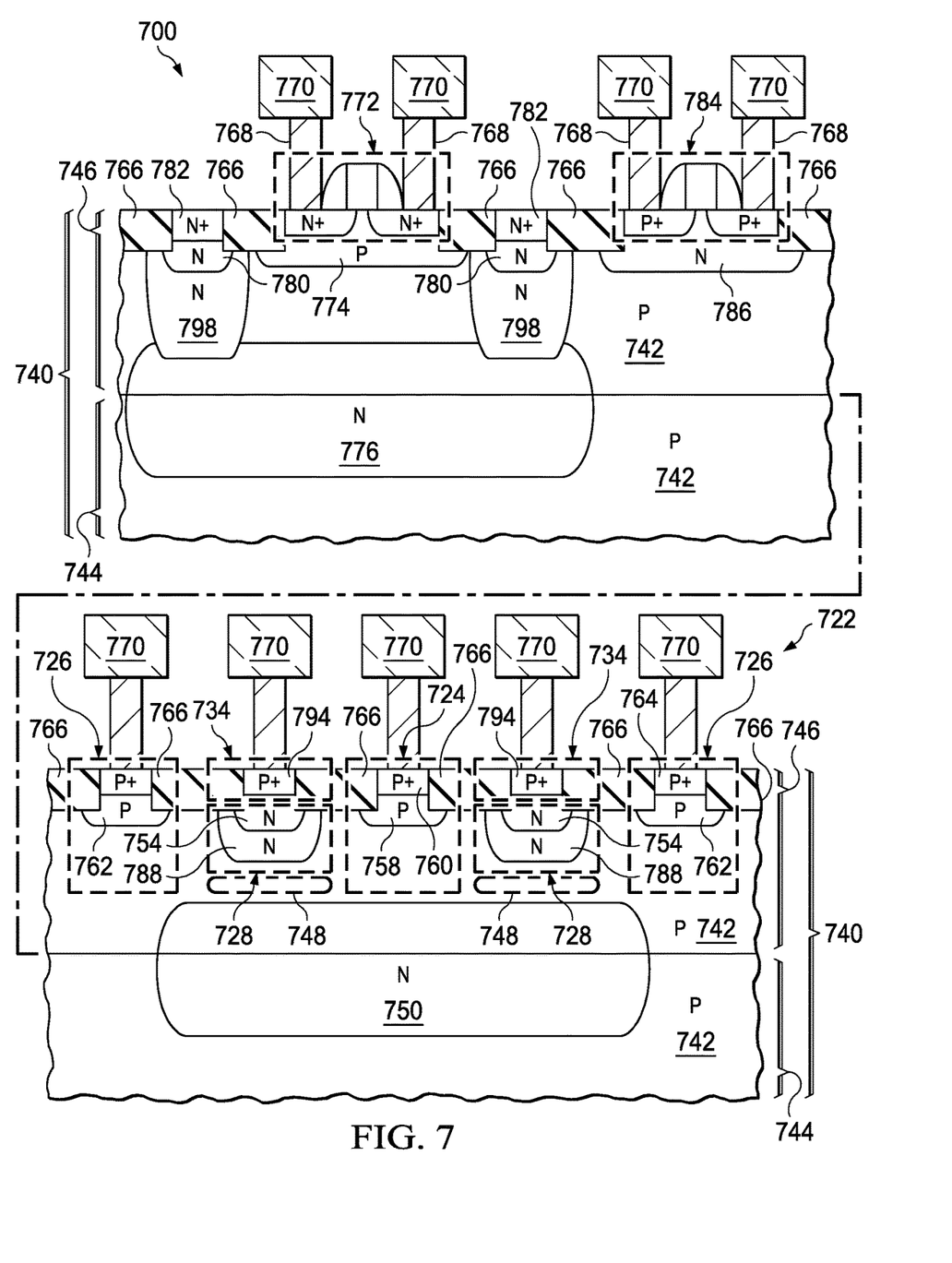
FIG. 7 is a cross section of a further example semiconductor device having a triggered clamp in parallel with a variable shunt.

FIG. 7 is a cross section of a further example semiconductor device having a triggered clamp in parallel with a variable shunt. The semiconductor device 700 has a substrate 740 which includes semiconductor material 742 of a base wafer 744 and an epitaxial layer 746 on a top surface of the base wafer 744. In the instant example, the semiconductor material 742 may be p-type.

The semiconductor device 700 includes a depletion mode JFET 722 formed in the substrate 740. The depletion mode JFET 722 is part of a variable shunt which connects a protected line of the semiconductor device 700 to a ground line of the semiconductor device 700. The ground line is electrically connected to the semiconductor material 742. The depletion mode JFET 722 has a gate 728 which is located above a p-type channel region 748. In the instant example, the gate 728 may include a first deep n-type well 788 over and abutting the channel region 748, and a first shallow n-type well 754 in the first deep n-type well 788. The first deep n type well 788 extends deeper into the substrate 740 than the first shallow n type well 754. A source 724 of the depletion mode JFET 722 includes a source portion of the epitaxial layer 746 that is laterally surrounded by the gate 728 and the channel region 748, a first shallow p-type well 758 in the source portion of the epitaxial layer 746, and a p-type source contact region 760 above the first shallow p-type well 758. A drain 726 of the depletion mode JFET 722 includes a drain portion of the p-type semiconductor material 742 laterally surrounding the gate 728, a second shallow p-type well 762 above the drain portion of the p-type semiconductor material 742, and a p-type drain contact region 764 above the second shallow p-type well 762. A first n-type buried layer 750 is located under the channel region 748 and the source 724. In the instant example, the depletion mode JFET 722 is a horizontal JFET, in that current flowing through the channel region 748 flows primarily in a horizontal direction, that is, parallel to a top surface of the substrate 740.

In the instant example, a blocking diode 734 is in series with the gate 728. An anode of the blocking diode 734 may include a p-type anode contact region 794 above the first shallow n-type well 754. A pn junction of the blocking diode 734 is provided by the p-type anode contact region 794 and the first shallow n-type well 754, which may advantageously provide a reduced area for the blocking diode 734, thereby enabling a smaller area for the semiconductor device 700.

The p-type source contact region 760, the p-type anode contact region 794, and the p-type drain contact region 764 may be laterally isolated from each other by field oxide 766. Contacts 768 and interconnects 770 of the semiconductor device 700 provide electrical connections to the p-type source contact region 760, the p-type anode contact region 794, and the p-type drain contact region 764. The horizontal configuration of the depletion mode JFET 722 of the instant example may provide a desired lower resistance between the protected line and the ground line than a vertical depletion mode JFET, due to the higher current-carrying area of the channel region 748.

The semiconductor device 700 may optionally further include an isolated NMOS transistor 772. The isolated NMOS transistor 772 is in a third shallow p-type well 774 which is isolated from the p-type semiconductor material 742 of the base wafer 744 by an n-type isolation structure. The n-type isolation structure of the instant example includes a second lower n-type buried layer 776, an n-type sinker 798 above the second lower n-type buried layer 776, a second shallow n-type well 780 above the n type sinker 798, and an n-type isolation contact region 782 above the second shallow n-type well 780. The semiconductor device 700 may optionally further include a PMOS transistor 784, in a third shallow n-type well 786. Corresponding elements of the depletion mode JFET 722, the isolated NMOS transistor 772, and the PMOS transistor 784 may have similar structures and dopant distributions, as a result of being formed concurrently, advantageously reducing a fabrication cost of the semiconductor device 700 compared to forming the corresponding elements separately.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:
1. A semiconductor device, comprising:
   a semiconductor substrate;
   a ground line electrically coupled to the semiconductor substrate;
   a protected line;

a triggered clamp electrically coupling the protected line to the ground line; and a variable shunt electrically coupled between the protected line and the ground line, and parallel to the triggered clamp, the variable shunt including a depletion mode junction field effect transistor (JFET) having a drain region in the substrate, wherein the drain region is contiguous with the semiconductor substrate and wherein a date of the depletion mode JFET includes a buried layer in the semiconductor substrate, the buried layer having an opposite conductivity type from the semiconductor substrate.

2. The semiconductor device of claim 1, wherein the semiconductor substrate is p-type and the depletion mode JFET is a p-channel depletion mode JFET.

3. The semiconductor device of claim 1, further comprising an input pad, wherein the gate of the depletion mode JFET is electrically coupled to the input pad.

4. The semiconductor device of claim 1, further comprising a voltage generator circuit, wherein the gate of the depletion mode JFET is electrically coupled to the voltage generator circuit.

5. The semiconductor device of claim 1, wherein the depletion mode JFET has a vertical configuration, wherein current flows through a channel region of the depletion mode JFET in a direction perpendicular to a top surface of the semiconductor substrate.

6. The semiconductor device of claim 1, wherein the depletion mode JFET has a horizontal configuration, wherein current flows through a channel region of the depletion mode JFET in a direction parallel to a top surface of the semiconductor substrate.

7. The semiconductor device of claim 1, further comprising second buried layer in the semiconductor substrate, wherein the buried layer is a first buried layer, and the second buried layer and the first buried layer have similar compositions and structures.

8. A semiconductor device, comprising:
a semiconductor substrate;
a ground line electrically coupled to the semiconductor substrate;
a protected line;
a triggered clamp electrically coupling the protected line to the ground line; and
a variable shunt electrically coupled between the protected line and the ground line, and parallel to the triggered clamp, the variable shunt including a depletion mode junction field effect transistor (JFET) having a drain region in the substrate, wherein the drain region is contiguous with the semiconductor substrate, wherein a gate of the depletion mode JFET includes a well in the substrate, the well having an opposite conductivity type from the semiconductor substrate.

9. The semiconductor device of claim 8, further comprising a second well in the substrate, wherein the well is a first well, and the second well and the first well have similar compositions and structures.

10. The semiconductor device of claim 1, further comprising a blocking diode in series with the gate of the depletion mode JFET, wherein the gate is n-type, and an anode of the blocking diode is electrically coupled to the gate.

11. The semiconductor device of claim 10, wherein the anode blocking diode includes a p-type semiconductor region in the substrate, contiguous with the gate.

12. The semiconductor device of claim 1, further including a gate clamp electrically coupled between the gate of the depletion mode JFET and the ground line, the gate clamp being configured to provide a low impedance connection between the gate and the ground line when a potential of the gate exceeds a prescribed value.

13. A method, comprising:
providing a semiconductor substrate of a semiconductor device, the semiconductor substrate having a first conductivity type;
forming a gate of a depletion mode junction field effect transistor (JFET) in the semiconductor substrate, the gate having a second conductivity type, opposite from the first conductivity type, wherein a drain of the depletion mode JFET is contiguous with the semiconductor substrate;
forming an electrical connection between the semiconductor substrate and a ground line of the semiconductor device;
forming an electrical connection between a source of the depletion mode JFET and a protected line of the semiconductor device; and
forming a triggered clamp in the semiconductor device, the triggered clamp being electrically coupled between the protected line and the ground line, and parallel with the depletion mode JFET.

14. The method of claim 13, wherein the first conductivity type is p-type and the second conductivity type is n-type.

15. The method of claim 13, wherein forming the gate includes forming a buried layer in the semiconductor substrate.

16. The method of claim 15, further comprising forming a second buried layer, wherein the buried layer is a first buried layer, and the second buried layer is formed concurrently with the first buried layer.

17. The method of claim 13, wherein forming the gate includes forming a well in the substrate.

18. The method of claim 13, further comprising forming a blocking diode in the substrate by forming a semiconductor region having the first conductivity type in contact with the gate.

19. The method of claim 13, further comprising forming a gate clamp electrically coupled between the gate and the ground line, the gate clamp being configured to provide a low impedance connection between the gate and the ground line when a potential of the gate exceeds a prescribed value.

20. A semiconductor device comprising:
a semiconductor substrate having a first conductivity type;
a gate of a depletion mode junction field effect transistor (JFET) in the semiconductor substrate, the gate having a second conductivity type, opposite from the first conductivity type, wherein a drain of the depletion mode JFET is contiguous with the semiconductor substrate;
an electrical connection between the semiconductor substrate and a ground line of the semiconductor device;
an electrical connection between a source of the depletion mode JFET and a protected line of the semiconductor device; and
a triggered clamp in the semiconductor device, the triggered clamp being electrically coupled between the protected line and the ground line, and parallel with the depletion mode JFET.

21. The device of claim 20, wherein the first conductivity type is p-type and the second conductivity type is n-type.

22. The device of claim 20, wherein the gate includes a buried layer in the semiconductor substrate.

23. The device of claim 20, wherein the gate includes a well in the substrate.

\* \* \* \* \*